United States Patent [19]
Wildes et al.

[11] Patent Number: 5,951,304
[45] Date of Patent: Sep. 14, 1999

[54] FANOUT INTERCONNECTION PAD ARRAYS

[75] Inventors: Douglas Glenn Wildes, Ballston Lake; Robert Stephen Lewandowski, Amsterdam, both of N.Y.

[73] Assignee: General Electric Company, Schenectady, N.Y.

[21] Appl. No.: 08/861,043

[22] Filed: May 21, 1997

[51] Int. Cl.⁶ .................................................. H01R 9/09
[52] U.S. Cl. ........................... 439/67; 439/493; 361/777; 361/749; 174/261; 257/786
[58] Field of Search ............................... 439/67, 493, 91; 361/777, 749; 174/261; 257/786

[56] References Cited

U.S. PATENT DOCUMENTS

| | | | |
|---|---|---|---|
| 4,055,003 | 10/1977 | Sack | 34/632 |
| 4,789,889 | 12/1988 | Morris et al. | 257/786 |
| 4,953,005 | 8/1990 | Carlson et al. | 357/80 |
| 5,038,251 | 8/1991 | Sugiyama et al. | 361/398 |
| 5,040,069 | 8/1991 | Matsumoto et al. | 358/213.11 |
| 5,172,472 | 12/1992 | Lindner et al. | 29/845 |
| 5,467,779 | 11/1995 | Smith et al. | 128/660 |
| 5,469,072 | 11/1995 | Williams et al. | 324/754 |
| 5,484,186 | 1/1996 | Van Order et al. | 296/97.5 |
| 5,499,444 | 3/1996 | Doane, Jr. et al. | 29/830 |
| 5,546,279 | 8/1996 | Aota et al. | 361/749 |
| 5,558,523 | 9/1996 | Coteus et al. | 439/67 |
| 5,818,114 | 10/1998 | Pendse et al. | 257/786 |

OTHER PUBLICATIONS

Rajendra D. Pendse, Rita N. Horner and Fan Kee Loh, "Radially Staggered Bonding Technology", Hewlett–Packard Journal, Dec. 1996, pp. 41–50.

Rita N. Horner, Rajendra D. Pendse, Fan Kee Loh, "Implementation of Pad Circuitry for Radially Staggered Bond Pad Arrangement", Hewlett–Packard Journal, Dec. 1996, pp. 51–54.

*Primary Examiner*—Steven L. Stephan
*Assistant Examiner*—Barry M. L. Standig
*Attorney, Agent, or Firm*—Marvin Snyder; Douglas E. Stoner

[57] ABSTRACT

For providing multiple-conductor circuit interconnections where there is a lack of precise dimensional control, as in manufacturing flexible printed circuits used to make high density electrical interconnections between ultrasonic transducer elements and the probe cable in a medical ultrasound probe, connection pads are formed in fanout arrays, with the longitudinal axes of individual pads extending along radial lines from the center of a circle. The fanout arrays are formed within generally trapezoidal areas, each having two parallel opposite sides extending along respective parallel chords to accommodate significant variation in dimensions of the respective substrates being connected. Multiple-row connection pad arrays may be provided, each with a plurality of fanout arrays of connection pads that may be parallel to each other and positioned at respectively different distances from the center of the circle, or may be arranged around, and positioned at equal distances from, the center of the circle. If the circuit substrate is anisotropic, the connection pads are on curved pad-locating lines defined by $y=Ax^\beta$, where $(x,y)=(0,0)$ defines the circle center, A is a proportionality constant for the respective pad-locating line, and $\beta$ is an anisotropy factor.

20 Claims, 8 Drawing Sheets

FANOUT INTERCONNECTION PAD ARRAYS

BACKGROUND OF THE INVENTION

This invention relates to circuit interconnections and, more particularly, to multiple-conductor circuit interconnections in which a pattern of connection pads is provided on a substrate such as a printed circuit board, especially where there is a lack of precise dimensional control as is typically the case with flexible printed circuit substrates.

A particular application of the invention is the manufacture of ultrasound probes for medical applications. As the number of transducer elements in typical ultrasound probes increases and the desired size of the probe handle and other packaging decreases, there is a need to increase the density of electrical connections between the transducer elements and the probe cable. For reasons of manufacturability and economics, the transducer pallet and cable are usually built and tested as separate subassemblies, then joined. If the pallet and cable each terminate in a flexible printed circuit, then the preferred joint is a flex-to-flex bond. Such a bond comprises one or more rows of metallized connection pads on the transducer pallet flex circuit, similar row(s) of pads on the cable flex circuit, and an anisotropic conductive adhesive which, under heat and pressure, forms an electrical and mechanical bond between corresponding connection pads of the two flex circuits.

Flexible printed circuit substrates are typically made of a polyimide, such as Kapton® (a DuPont product), with a typical thickness within the range of 25 to 75 microns. Another flexible printed circuit substrate material conventionally employed is polyester.

A factor that limits the achievable density of a flex-to-flex bond is the need to allow for variations in the pad pitch between the two flexible printed circuits. Typically there is a lack of precise dimensional control during manufacture of flexible printed circuits. Dimensional variations, due to temperature, humidity, flex circuit shrinkage, and other manufacturing variables, constrain both the minimum pad width (to achieve electrical contact at all pads) and the minimum space between pads (to avoid short circuits). Design of a flex-to-flex bond becomes a tradeoff between desire for high density and good yield, and the cost of tight tolerances for the flexible printed circuits.

Electrical connection bonds between two flex circuits or between a flex circuit and a rigid circuit board are used in various situations and products, not just during the manufacture of ultrasound arrays. A major application is electrical connection to flat panel (LCD) displays for appliances, computers, and aircraft. Another application is the fabrication of multilayer flex circuits by lamination of two or more single-layer circuits with anisotropic conductive adhesive. Yet another application is the mounting of integrated circuit packages to a circuit board substrate employing surface mount technology. Tradeoffs between density, yield, and cost occur in the design of all of these products.

Conventionally these problems are addressed by attempting to compensate for dimensional variations. The initial artwork defining the connection pads is made slightly over- or under-size to compensate for the anticipated shrinkage or swelling of the parts during manufacturing. A problem with this approach is that the shrinkage varies slightly from one process run to another or from one batch of material to another, making it nearly impossible to predetermine the exact shrinkage. In any event, the pitch of the interconnection pads must be large enough to accommodate the residual variation in the dimensions of the parts.

SUMMARY OF THE INVENTION

The invention provides accurate alignment between respective arrays of connection pads which are electrically interconnected, so as to avoid need to increase the pitch of the interconnection pads to accommodate residual variation in the dimensions of two parts being interconnected through these arrays, and achieves a high connection density when making these electrical interconnections.

Briefly, in accordance with the invention, connection pads are formed in fanout arrays, with the longitudinal axes of individual pads aligned on radial lines extending from a common origin, allowing significant variations in the dimensions of the respective substrates being electrically connected to be accommodated.

In one form, a connection pad array of the invention formed on a substrate, such as a flexible printed circuit substrate where precise dimensional control is difficult, includes a set of elongated electrical connection pads arranged in a fanout array within a generally trapezoidal array area. The trapezoidal array area has two generally parallel opposite sides extending generally along respective parallel chords of a circle, such that the generally parallel opposite sides define narrower and wider sides of the fanout array. Each one of the pads extends longitudinally between the narrower and wider sides of the fanout array generally along a respective radial line extending from the center of the circle. Typically, the fanout array is symmetrical about a midpoint line extending from the center of the circle and perpendicular to the sides of the fanout array.

In a more general case, applicable where the substrate is anisotropic (meaning the shrinkage or expansion is not the same in all directions), the connection pads are on curved pad-locating lines which follow a power law relationship defined by the equation $y=Ax^\beta$, where the circle center is located at $(x,y)=(0,0)$, $A$ is a proportionality constant for the respective pad-locating line, and $\beta$ is an anisotropy factor.

The line equation $y=Ax^\beta$, for the anisotropic case simplifies to the line equation $y=Ax$ for the isotropic case when the anisotropy factor $\beta=1$.

In other embodiments, multiple-row connection pad arrays are provided. A multiple-row connection pad array includes a plurality of sets of elongated electrical connection pads arranged in respective fanout arrays as summarized hereinabove. Each of the array areas has two generally parallel opposite sides extending generally along respective parallel chords of a circle, the generally parallel opposite sides defining narrower and wider sides of the particular fanout array. In one form, the fanout arrays are parallel to each other, and positioned at different distances from the center of the circle. Typically, all of the fanout arrays are symmetrical about a single midpoint line extending from the center of the circle and perpendicular to the sides of the fanout arrays.

In another multiple-row connection pad array configuration, the fanout arrays are arranged around, and positioned at equal distances from, the center of the circle, generally forming a square, rectangle, or other polygon.

In accordance with another aspect of the invention, a multiple-conductor interconnect system includes a pair of substrates with respective circuits and respective corresponding connection pad arrays for electrically connecting the respective circuits when joined. Each of the connection pad arrays takes the form of a set of elongated electrical connection pads arranged in a fanout array within a generally trapezoidal array area as summarized hereinabove.

DETAILED DESCRIPTION

Figure 1:
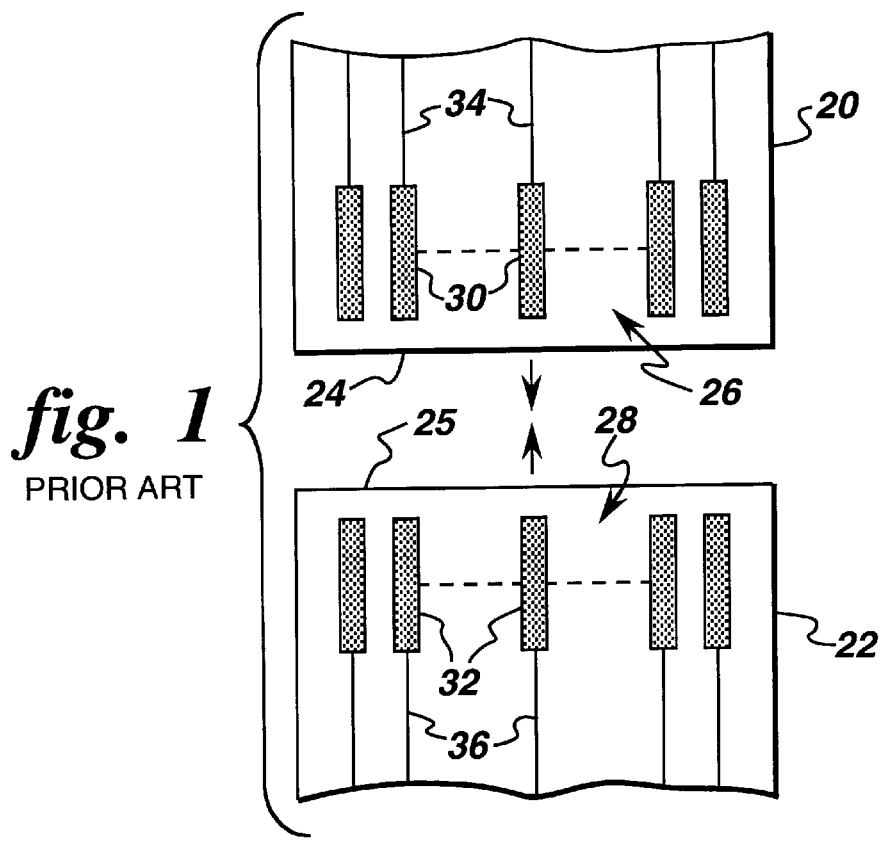
FIG. 1 is a plan view depicting a prior art interconnect system showing a pair of substrates supporting respective parallel pad connection pad arrays to be interconnected.

FIG. 1 illustrates a pair of substrates 20 and 22 having ends 24 and 25 supporting arrays 26 and 28 of prior art parallel connection pads 30 and 32. Circuits on substrates 20 and 22 to be electrically interconnected are represented by conductors 34 and 36 connected to pads 30 and 32, respectively. Typically, substrates 20 and 22 are flexible printed circuit board substrates, made of a suitable polyimide or polyester and are subject to shrinkage or swelling during manufacture. Illustratively, upper printed circuit board substrate 20, as a result of manufacturing processing, is relatively wider than lower substrate 22, and individual connection pads 30 of array 26 are spaced farther apart than individual connection pads 32 of array 28.

Figure 2:
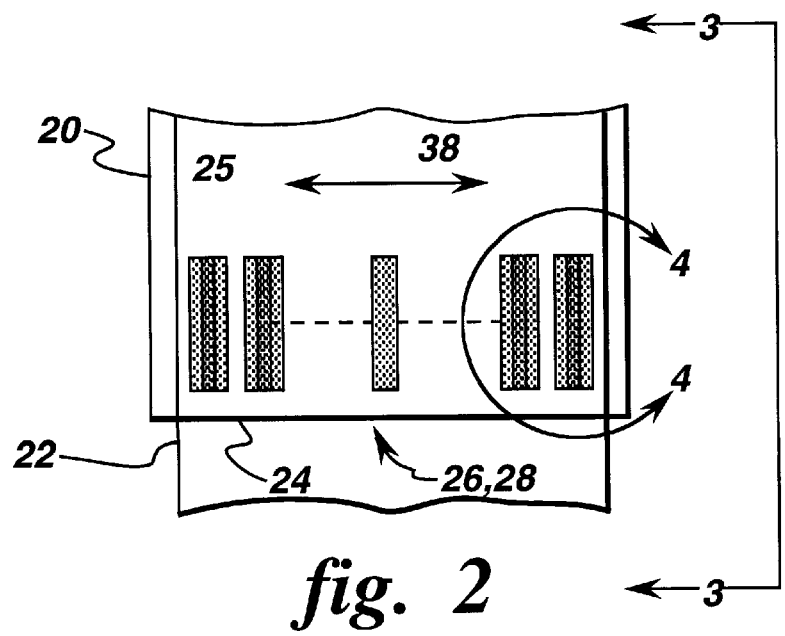
FIG. 2 is a plan view depicting the prior art substrates of FIG. 1 when joined.
Figure 3:
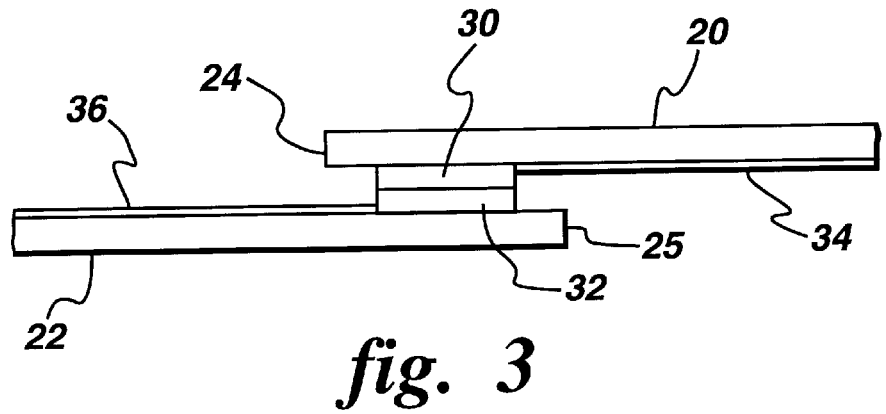
FIG. 3 is a side elevational view taken along line 3—3 of FIG. 2.

FIG. 2 depicts individual substrates 20 and 22 and corresponding arrays 26 and 28 overlapped for electrical connection through individual pads 30 of array 26 and corresponding individual pads 32 of array 28. The side elevational view of FIG. 3 represents the relative positions of substrates 24 and 26.

Due to manufacturing variations, the pitch of pads 32 of array 28 in this example is less than the pitch of pads 30 of array 26. As the two connection pad arrays 26 and 28 are brought together for bonding (FIG. 2), the principal alignment axis is right and left movement, illustrated by directional arrow 38. Thus, during assembly, the relative lateral position of the two substrates 20 and 22 is adjusted to minimize the offset between the outer pads, as is best seen in the enlarged view, FIG. 4, of the ends of arrays 26 and 28 in area 4—4. It will be appreciated that the situation at the opposite ends of arrays 26 and 28 is a mirror image.

Figure 4:
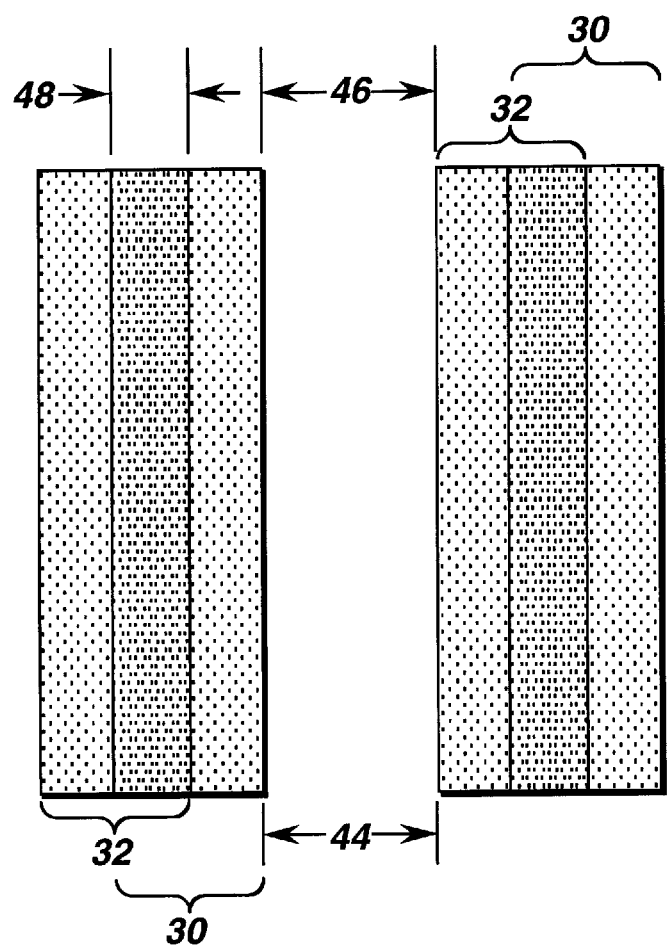
FIG. 4 is an enlarged view of area 4—4 of FIG. 2, illustrating lateral misalignment near the ends of the prior art parallel pad connection pad arrays.

In FIG. 4, the design spacing between adjacent pads is represented by distance 44, while the actual spacing 46 achieved near the ends of arrays 26 and 28 is substantially less. Pad overlap occurs in region 48.

Thus, as distance from the center of arrays 26 and 28 increases, actual spacing 46 between adjacent bonded pads becomes smaller, increasing the probability of short circuits. Overlap 48 between corresponding mating pads also decreases, reducing reliability of the connection of the outer pads.

With the arrangement of parallel pads shown in FIGS. 1 and 2, the center pads retain 100% overlap, but overlap of the outer pads is reduced by N times the size difference, where N is the number of pads in the row. As one example, for a row of 100 pads and for flex circuits which differ by 0.5%, overlap of the outer pads is reduced by 50%, assuming the pad width is half the pad pitch.

Figure 5:
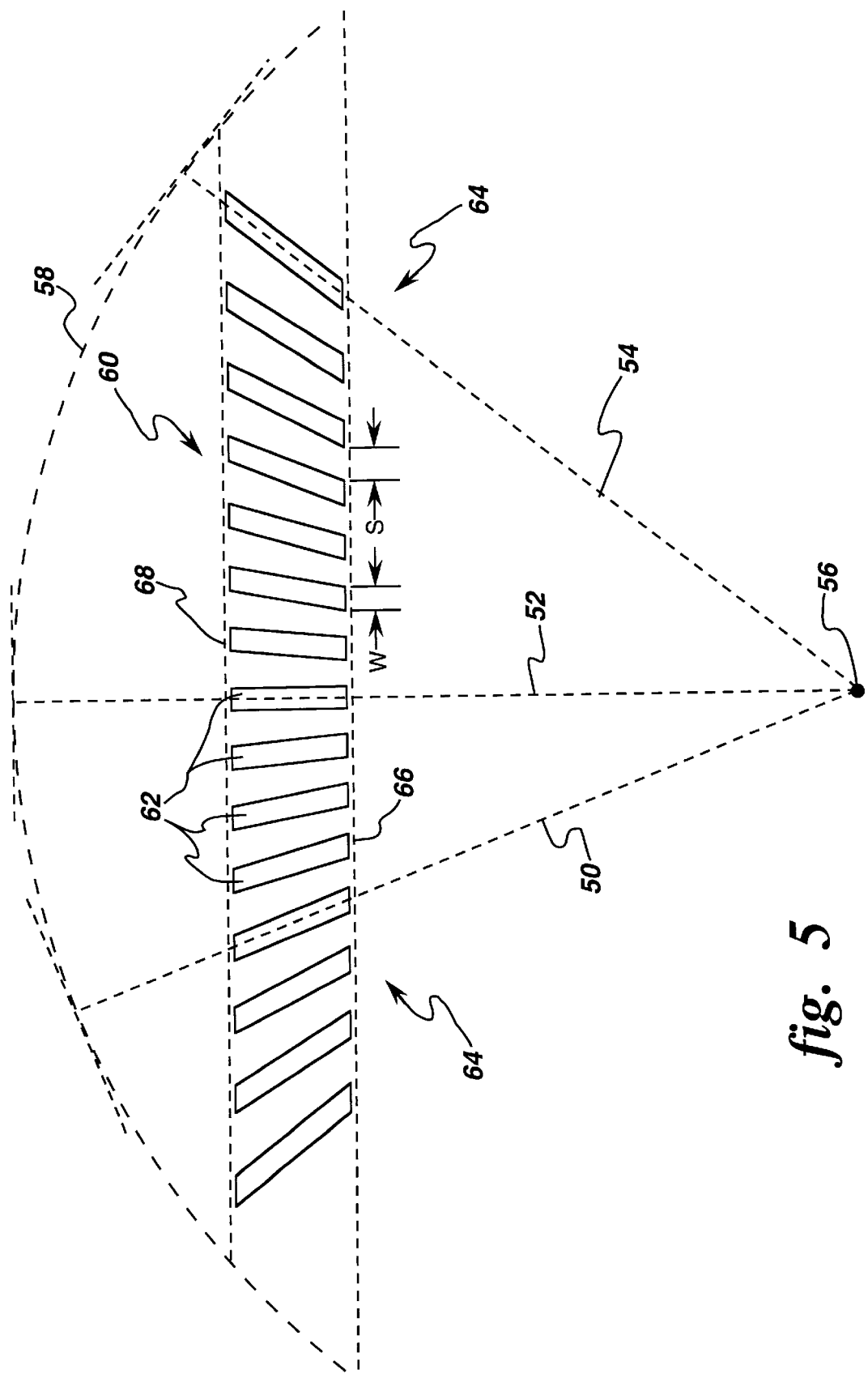
FIG. 5 is a geometrical representation depicting the manner in which fanout connection pads of the invention extend along radial lines from a common origin.

As shown in FIGS. 5–9, the invention employs a fanout pad arrangement wherein the connection pads of each array are longitudinally aligned along radial lines, such as, for example, representative radial lines 50, 52 and 54 in FIG. 5, extending from the center 56 of a circle represented in partial form as an arc 58. As shown in FIG. 5, a fanout array 60 of individual elongated pads 62 is contained within a generally trapezoidal array area 64 having two generally parallel opposite sides extending generally along respective parallel chords 66 and 68 of circle 58. Line 66 defines a relatively wider side of trapezoidal fanout array 60, and line 68 defines a relatively narrower side of fanout array 60. Each pad 62 extends longitudinally between wider 66 and narrower 68 sides generally along a respective radial. Individual pads 62 have a width w and are spaced from each other by a spacing distance s such that pitch $p=w+s$.

Preferably, fanout array 60 is symmetrical about a midpoint line which, in FIG. 5, is radial line 52, extending from center 56 of circle 58 perpendicular to sides 66 and 68 of fanout array 60. Although midpoint line 52 is shown intersecting one of pads 62, symmetry can also be maintained in alternative arrangements where midpoint line 52 extends between two pads 62, with no connection pad actually aligned on midpoint line 52.

A practical application of fanout array 60 is represented in FIGS. 6–9. A pair of substrates 70 and 72, which typically are flexible printed circuit substrates characterized by a lack of dimensional control during manufacture, have respective ends 74 and 76 and support respective arrays 78 and 80 of individual connection pads 82 and 84 for establishing electrical connections between respective circuits represented by conductors 86 on substrate 70 and conductors 88 on substrate 72. Due to process variations, substrate 70 illustratively is wider than substrate 72, and pads 82 of array 78 accordingly are spaced farther apart than pads 84 of array 80.

Figure 6:
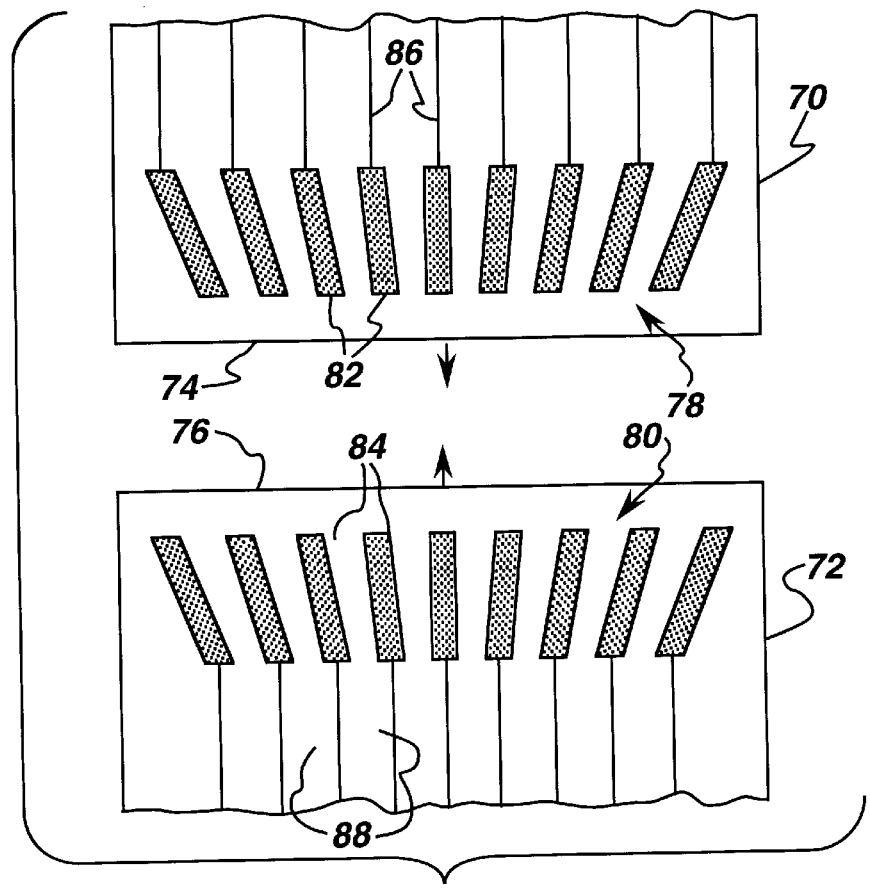
FIG. 6 is a plan view depicting a pair of substrates supporting respective fanout connection pad arrays for electrically connecting respective circuits on the substrates in accordance with the invention.

It will be appreciated that conventional standard practices for routing traces to the parallel pads of prior art FIG. 1 are equally applicable to the fanout pads of FIG. 6.

Figure 7:
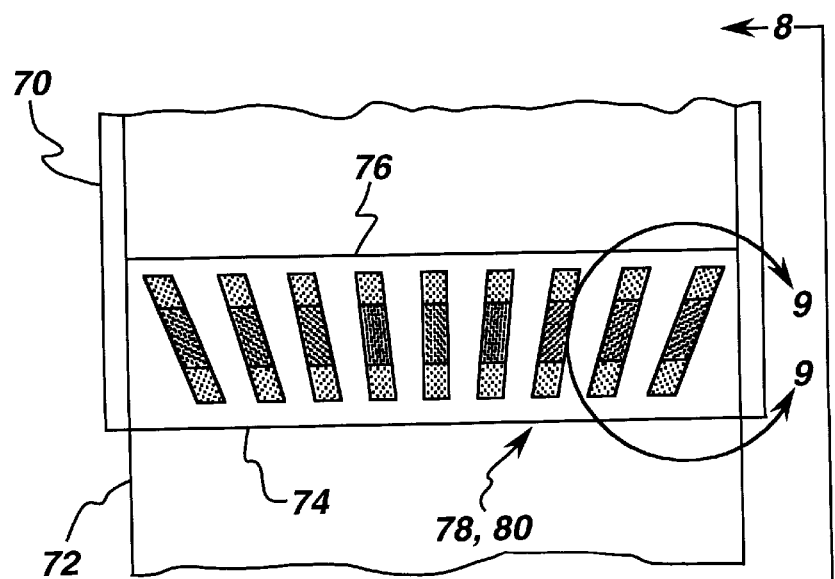
FIG. 7 is a plan view depicting the substrates and connection pad arrays of FIG. 6 when joined.
Figure 8:
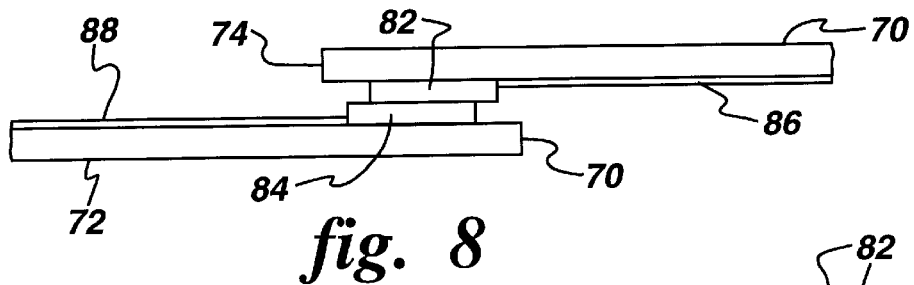
FIG. 8 is a side elevational view taken along line 8—8 of FIG. 7.
Figure 9:
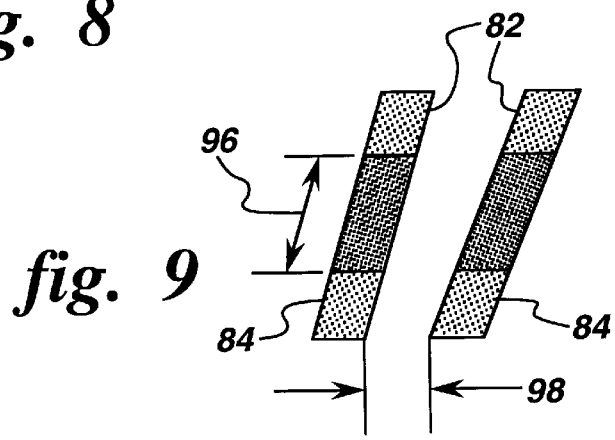
FIG. 9 is an enlarged view of area 9—9 of FIG. 7, depicting the manner in which dimensional variations are accommodated at the ends of fanout connection pad arrays in accordance with the invention.

When the printed circuits of FIG. 6 are joined as shown in FIGS. 7 and 8, two alignment axes are available, i.e., lateral and longitudinal, enabling 100% overlap of corresponding pads across the widths of the connection pads. With particular reference to the enlarged view of FIG. 9, connection pad overlap occurs over a distance 96, and the actual space 98 between adjacent pads 84 is the same as the design spacing.

Figure 10:
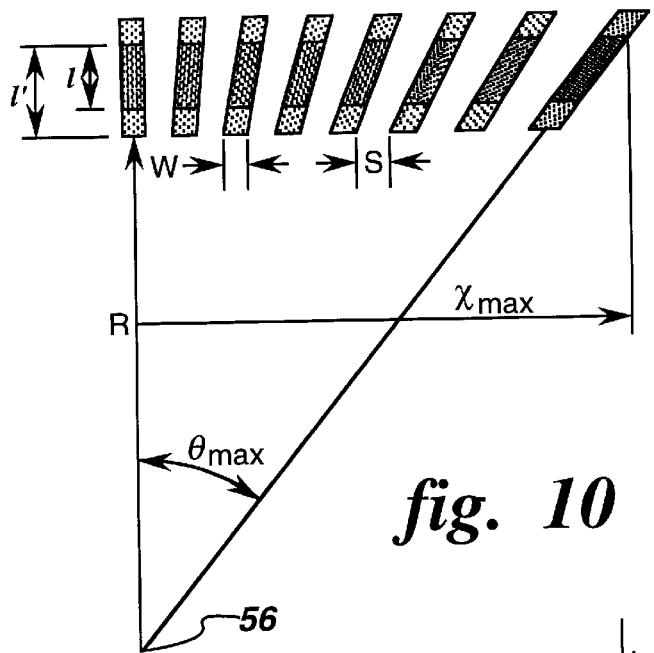
FIG. 10 illustrates a design procedure for a multiple-conductor interconnect system in accordance with the invention.

A typical design process for a fanout pad array in accordance with the invention is illustrated in FIG. 10. A single row of N connection pads has a minimum contact area (or bond area) of width w and length l. The minimum space between pads is s. The manufacturing tolerance on the flex circuits is specified as $-0, +\alpha$, where $\alpha$ is expressed either as a percentage (e.g. 5%) or as a decimal fraction (e.g. 0.05).

In FIG. 10 (which shows only half of the row of connection pads), the narrow end of the fanout array is laid out at a pitch p=w+s and has total width (center-to-center of outer pads) of (N−1)p. If the pads fan out from a center which is at distance R from the narrow end, then the outer pads slant at angle:

$$\theta_{max} = \tan^{-1}\left(\frac{\frac{N-1}{2}p}{R}\right).$$

The total width at the broad end of the fanout is:

$$2x_{max} = 2(R + l')\tan\theta_{max} = (N-1)p\left(1 + \frac{l'}{R}\right).$$

The above analysis is an approximation only. For a more rigorous analysis, pad width w and minimum pitch p should be measured not along a horizontal line, but perpendicular to the longitudinal axis of each respective pad. If this is done correctly, and the minimum pitch is strictly adhered to during design, then the actual width of the fanout pad array will be slightly greater than implied by the equations herein. This difference becomes more significant as the fanout angle increases, and is one reason why distance R from the pad array to virtual center 56 should not be too small.

Under worst-case conditions, one flexible substrate circuit has pitch p and the mating circuit has pitch $p(1+\alpha)$. Equivalently, the distances from the narrow end of the fanout to virtual center 56 are R and $R(1+\alpha)$, respectively. When the circuits are aligned, the connection pad overlap is:

$(R+l')-R(1+\alpha)=l'-\alpha R.$

Since the minimum overlap is specified as l, this sets the actual pad length, $l'=l+\alpha R$.

Another design parameter is the distance R from the pad array to virtual center 56. Increasing R reduces the fanout angle $\theta_{max}$, and the total width, $$2x_{max}(1+\alpha) \approx (N-1)p\left(1 + 2\alpha + \frac{l}{R}\right).$$

However decreasing R also reduces the pad length $l'=l+\alpha R$, and reduces the maximum distance $\alpha R$ by which the two flexible circuit substrates may have to be offset in order to obtain alignment.

Thus, increasing R (which tends towards a conventional parallel pad arrangement) beneficially reduces total width by reducing fanout; however, increasing R also disadvantageously increases the required actual length l' of the pads and disadvantageously increases the maximum distance $\alpha R$ by which the two flex circuits may have to be offset in order to obtain alignment. This tradeoff must be resolved by considering the lateral vs. longitudinal constraints of the intended application.

Figure 11:
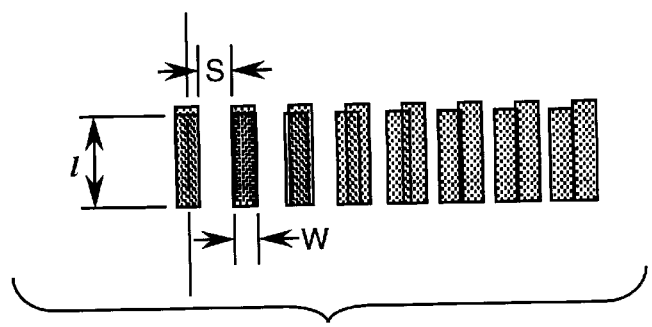
FIG. 11 depicts an unacceptable result which would occur if a similarly-spaced arrangement of prior art parallel pads were subjected to the same percentage of dimensional variation accommodated by the invention as depicted in FIG. 10.
Figure 12:
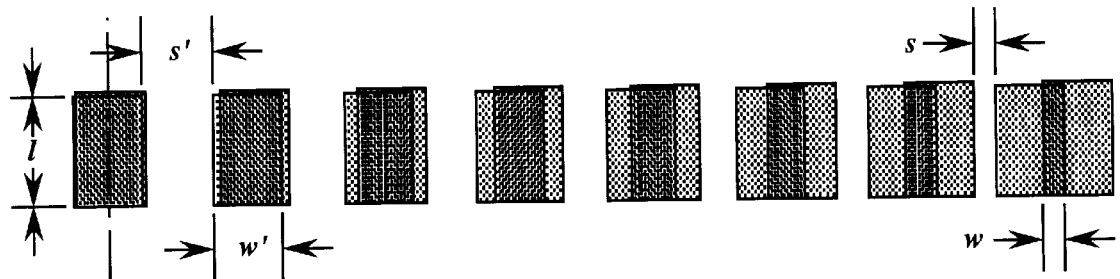
FIG. 12 is an illustration of how the parallel pads of FIG. 11 would have to be redesigned in order to maintain at least a minimum electrical contact area and a minimum spacing between electrical connection pads.

To show the compactness of the fanout arrangement of connection pads, FIGS. 11 and 12 respectively depict an unacceptable result if a similarly-spaced arrangement of prior art parallel connection pads were subjected to the same percentage of dimensional variation accommodated by the invention as depicted in FIG. 10, and how the prior art parallel connection pads would have to be redesigned in order to maintain at least a minimum required contact area and a minimum required spacing between connection pads.

The connection pads ahown in FIG. 11 are of the same size and pitch as those shown in FIG. 10; however, when subjected to the same dimensional mismatch ($\alpha$=0.05 or 5% in each of FIGS. 10, 11 and 12), the pads at the ends of the row shown in FIG. 11 misalign completely and make no contact.

To meet specification, the parallel connection pad array would have to be redesigned as shown in FIG. 12, where the pad width w' and pitch p' are related as follows:

$$\left(1 + \frac{\alpha}{2}\right)w' = w + \frac{N-1}{2}\alpha p',$$

$$p' = \frac{p}{1-(N-2)\alpha}.$$

This yields a total width of:

$(N-1)p'>(N-1)p(1+(N-2)\alpha).$

For example, with N=15, $\alpha$=0.05 or 5%, and R=6l, the fanout design of FIG. 10 has width $2x_{max} \approx 17p$, whereas the parallel pad design of FIG. 12 has width (N−1)p'=40p.

Figure 13:
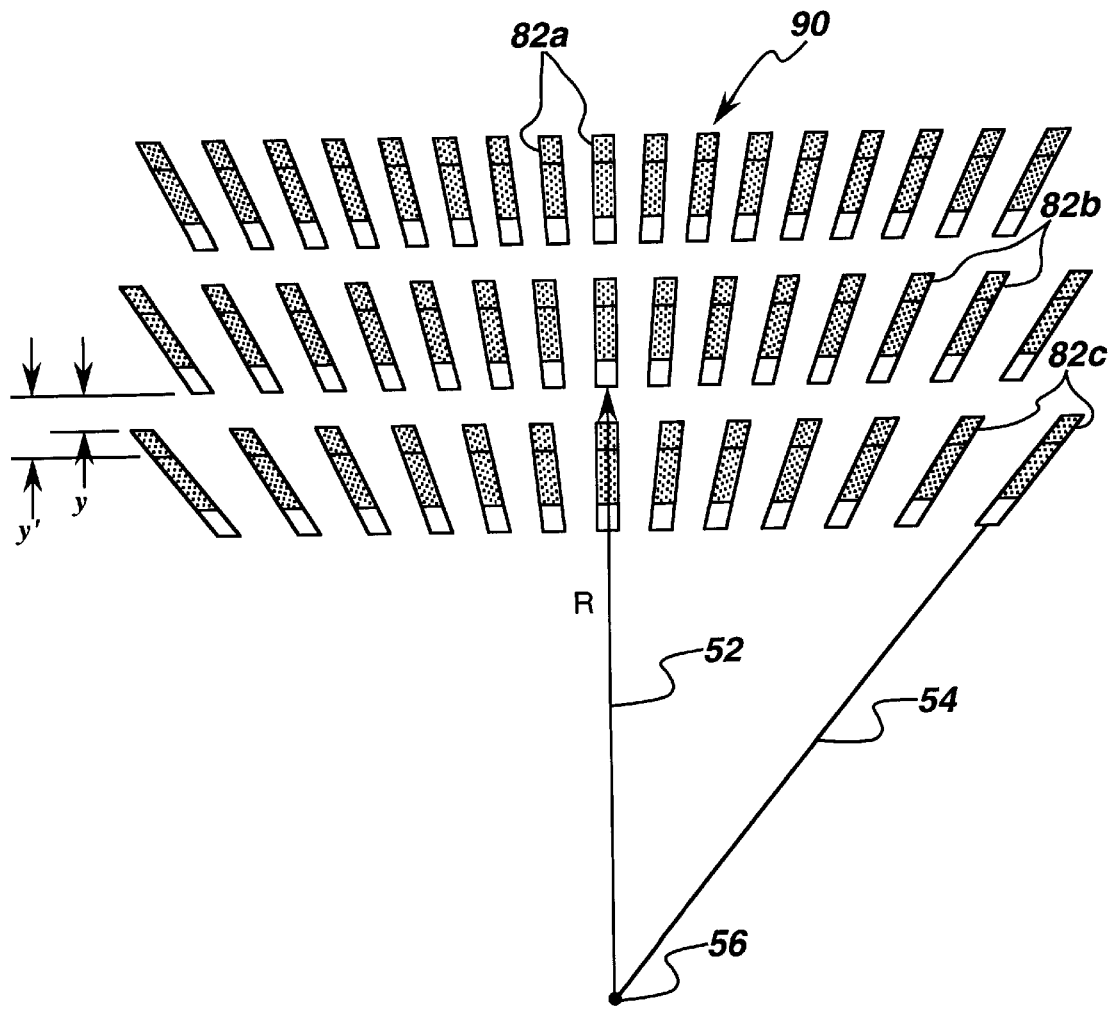
FIG. 13 depicts one form of a multiple-row connection pad array in accordance with the invention.

A multi-row version 90 of the fanout pad array is shown in FIG. 13. Three rows of pads 82a, 82b, 82c, respectively, are employed. If the minimum space between rows of the assembled flexible substrate-to-flexible substrate joint is y, then the circuits must be designed with a gap y' such that, when the circuits are aligned, $R-(R-y')(1+\alpha) \approx y'-\alpha R \geq y.$ This is additional incentive to keep distance R relatively small. However, if R is small and the row pitch l'+y' becomes non-negligible relative to R, then gap y' should be re-calculated for each row. If the row widths are also comparable to R, then the rate of fanout and the number of bond pads which will fit in a given width varies significantly from row to row.

As a specific example, consider a row of N=101 pads with minimum width w=0.15 mm, bond length l=2.0 mm, and space s=0.15 mm. Assume the manufacturing tolerance $\alpha$=0.003=0.3%. These values are typical of flexible substrate-to-flexible substrate bonds for ultrasound transducers. The nominal pitch is p=w+s=0.3 mm and the total width of the narrow side of the fanout is (N−1)p=30 mm. Setting $$R = (N-1)p = 30 \text{ mm yields } \theta_{max} = \tan^{-1}\left(\frac{1}{2}\right) \approx 27°,$$

which makes the longitudinal alignment (i.e., in a direction parallel to R) of the pads about half as difficult as the lateral alignment. Pad length $l'=l+\alpha R \approx 2.1$ mm and the total width of the wider side of the fanout array is $$2x_{max} = (N-1)p\left(1+\frac{l'}{R}\right) \approx 32.1 \text{ mm}.$$

In the case of a multi-row design with, for example, a minimum gap between connection pad rows of $y=2s=0.3$ mm, the inter-row gap on each flexible substrate should be $y'=y+\alpha R \approx 0.4$ mm.

Figure 14:
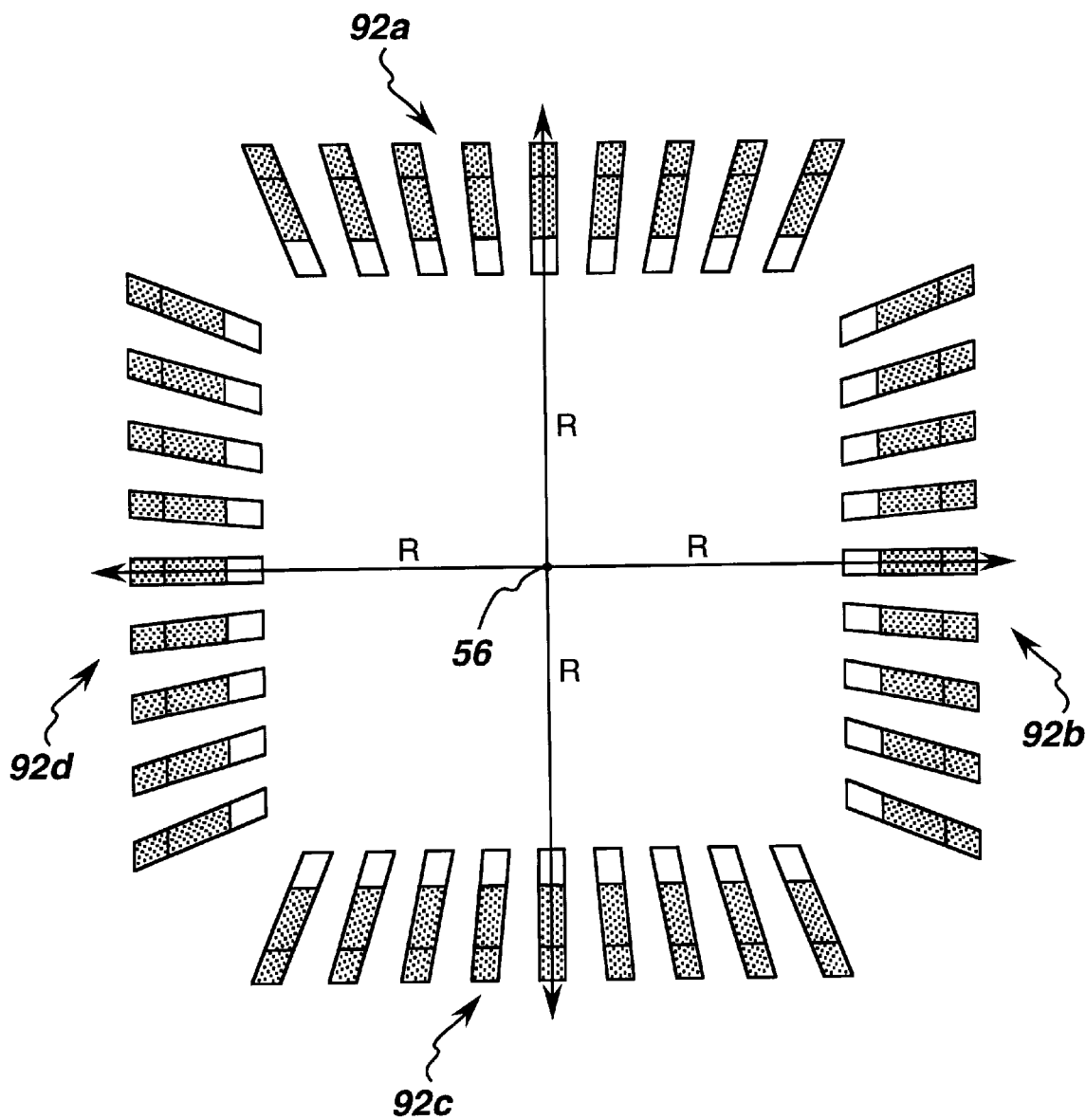
FIG. 14 depicts another form of a multiple-row connection pad array in accordance with the invention.

FIG. 14 depicts another form of multiple-row connection pad array where the pads of respective fanout arrays 92a, 92b, 92c, and 92d are arranged around, and positioned at, equal distances from a center 56, generally forming a square, rectangle or other polygon. The FIG. 14 arrangement is particularly advantageous for connecting integrated circuit packages to underlying printed circuit substrates employing surface mount techniques. Advantageously, conventional circuit routing techniques are still applicable.

The foregoing analyses are based on the assumption that the shrinkage or expansion of flexible and other types of circuit boards during and after manufacture is isotropic, i.e., the same in all directions. Real flexible circuit board materials are slightly anisotropic, although not enough to have a major effect on the connection pad design.

An issue of potentially greater concern is anisotropy introduced by the pattern of metallization (or other processing). If the pattern is made up of many parallel conductors with unmetallized dielectric between them, then shrinkage parallel to the conductors is determined by the combined effects of metal and dielectric, while shrinkage perpendicular to the conductors has a significant contribution from the bare dielectric, unconstrained by metal. It would not be surprising to find an anisotropy of 2:1 or greater in the shrinkage or expansion of such circuit board.

Figure 15:
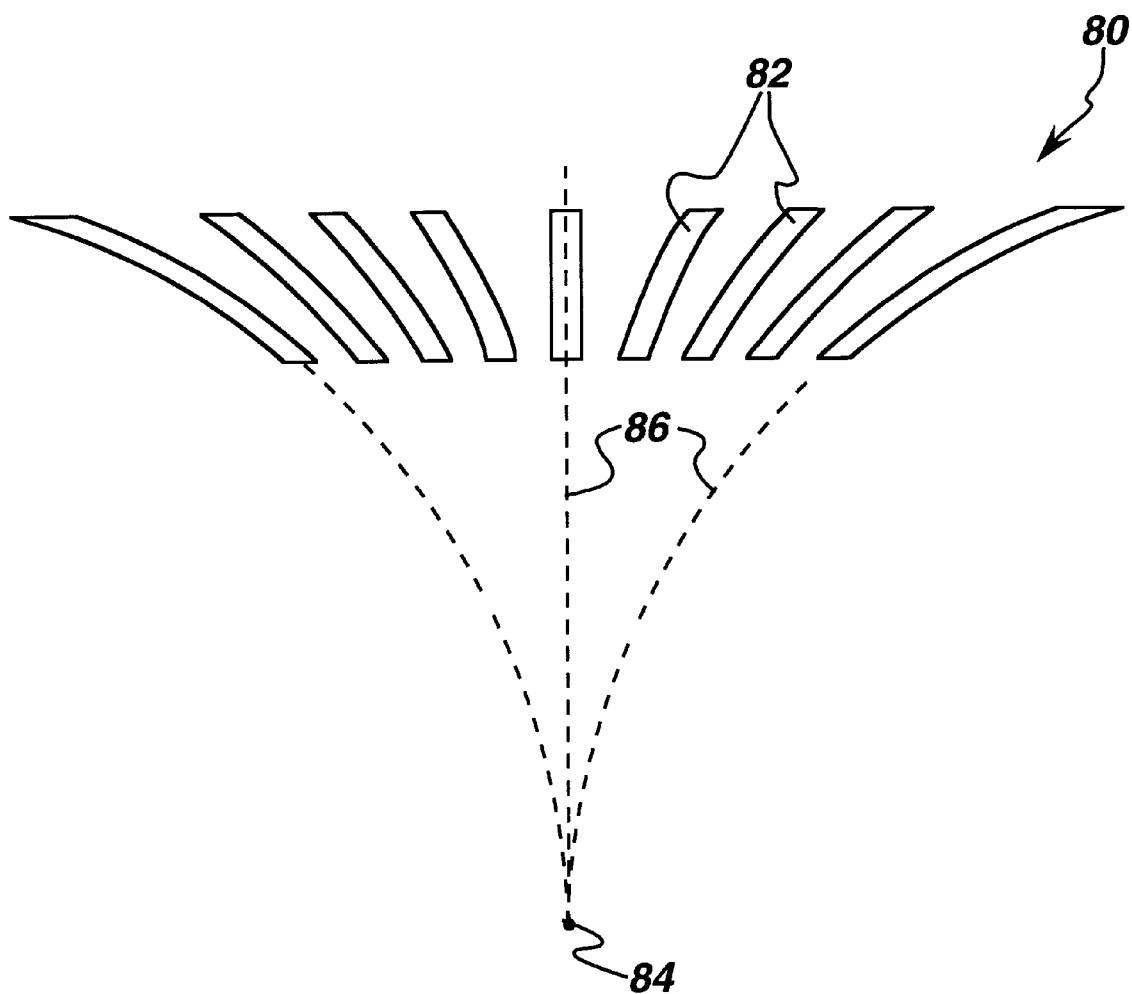
FIG. 15 depicts a fanout connection pad array for use when the substrate is subject to anisotropic shrinkage or expansion.

If shrinkage is expected to be anisotropic, then the connection pads are not situated along radial (i.e., straight) lines extending from a center; rather, the connection pads are situated along curved pad-locating lines which follow a power law relationship, as illustrated by an array 80 of connection pads 82 in FIG. 15.

For purposes of analysis center 84 is considered to be at $(x,y)=(0,0)$. In the isotropic example described above with reference to FIGS. 5–10, 13 and 14, each pad is situated along a straight radial line, $y=Ax$, where each radial line has a different proportionality constant A. In the anisotropic example of FIG. 15, connection pads 82 are situated along pad-locating lines 86 described as $y=Ax^\beta$, where A is a constant, different for each respective pad 82, and $\beta$ is the anisotropy factor. The line equation $y=Ax^\beta$ for the anisotropic example simplifies to the line equation $y=Ax$ for the isotropic case when $\beta=1$, meaning that there is no anisotropy.

In the particular example shown in FIG. 15, connection pads 82 are designed for anisotropic shrinkage described by the scaling $x \to (1+\alpha)x, y \to (1+\alpha\beta)y$, where the anisotropy factor $\beta=0.5$. The constants A for each respective one of the individual $y=Ax^\beta$ lines 86 are selected so that the pad pitch increases toward the ends of array 80 to maintain a uniform minimum spacing between pads 82. Similar considerations apply to the previously-described embodiments when shrinkage and expansion is anisotropic.

While specific embodiments of the invention have been illustrated and described herein, numerous modifications and changes will occur to those skilled in the art. It is therefore to be understood that the appended claims are intended to cover all such modifications and changes that fall within the true spirit and scope of the invention.

What is claimed is:

1. A connection pad array formed on a substrate, said pad array comprising:

a set of elongated electrical connection pads arranged in a fanout array within a generally trapezoidal array area having two generally parallel opposite sides extending generally along respective parallel chords of a circle having a center, the generally parallel opposite sides defining narrower and wider sides of the fanout array;

each pad of said set of pads extending longitudinally between the narrower and wider sides of the fanout array generally along a respective radial line extending from the center of the circle.

2. The connection pad array of claim 1, wherein the fanout array is symmetrical about a midpoint radial line extending from the center of the circle in a direction perpendicular to the sides of the fanout array.

3. The connection pad array of claim 1, wherein said substrate comprises a flexible printed circuit substrate.

4. The connection pad array of claim 1 wherein each respective pad of said set of pads extends between the narrower and wider sides of the fanout array generally along a respective pad-locating line extending from the center of the circle and defined by $y=Ax^\beta$, where the circle center is located at $(x,y)=(0,0)$, A is a proportionality constant for the respective pad locating line, and $\beta$ is an anisotropy factor.

5. The connection pad array of claim 4, wherein the fanout array is symmetrical about a midpoint line extending from the center of the circle in a direction perpendicular to the sides of the fanout array.

6. The connection pad array of claim 4, wherein said substrate comprises a flexible printed circuit substrate.

7. A multiple-row connection pad array formed on a substrate, said pad array comprising:

a plurality of sets of elongated electrical connection pads arranged in respective fanout arrays within respective generally trapezoidal array areas, each of the array areas having two generally parallel opposite sides extending generally along respective parallel chords of a circle having a center, the generally parallel opposite sides defining narrower and wider sides of the particular fanout array;

each pad of each of said sets of pads extending between the narrower and wider sides of the respective fanout array generally along a respective pad-locating line extending from the center of the circle and defined by $y=Ax^\beta$, where the circle center is located at $(x,y)=(0,0)$, A is a proportionality constant for the respective pad locating line, and $\beta$ is an anisotropy factor.

8. The multiple-row pad array of claim 7, wherein the fanout arrays of said connection pads are parallel to each other and positioned at respectively different distances from the center of the circle.

9. The multiple-row connection pad array of claim 8, wherein said fanout arrays are symmetrical about a midpoint line extending from the center of the circle in a direction perpendicular to the sides of the fanout arrays.

10. The multiple-row connection pad array of claim 7, wherein the fanout arrays are arranged around, and positioned at equal distances from, the center of the circle.

11. The multiple-row connection pad array of claim 10, wherein each respective one of the fanout arrays is symmetrical about a respective midpoint line extending from the center of the circle in a direction perpendicular to the sides of the respective fanout array.

12. The multiple-row connection pad array of claim 7, wherein said substrate comprises a flexible printed circuit substrate.

13. A multiple-conductor interconnect system comprising:

a pair of substrates with respective circuits and respective corresponding connection pad arrays for electrically connecting said respective circuits when joined;
   each of said connection pad arrays including:
      a set of elongated electrical connection pads arranged in a fanout array within a generally trapezoidal array area having first and second generally parallel opposite sides extending generally along respective parallel chords of a circle having a center, the first and second generally parallel opposite sides defining narrower and wider sides of the fanout array;
         each pad of said set of pads extending between the narrower and wider sides of the fanout array generally along a pad-locating line extending from the center of the circle and defined by $y=Ax^\beta$, where the circle center is located at $(x,y)=(0,0)$, A is a proportionality constant for the respective pad locating line, and $\beta$ is an anisotropy factor.

14. The interconnect system of claim 13, wherein each of the fanout arrays is symmetrical about a respective midpoint line extending from the center of the circle in a direction perpendicular to the sides of the respective fanout array.

15. The interconnect system of claim 13, wherein at least one of said substrates comprises a flexible printed circuit substrate.

16. The interconnect system of claim 13, wherein each of said connection pad arrays comprises:

a second set of elongated electrical connection pads arranged in respective fanout arrays within a second generally trapezoidal array area, said second array area having third and fourth generally parallel opposite sides extending generally along second respective parallel chords of said circle, the third and fourth generally parallel opposite sides defining narrower and wider sides of the second fanout array;
      each pad of each of said second set of pads extending between the narrower and wider sides of the second fanout array generally along a second pad-locating line extending from the center of the circle and defined by $y=Ax^\beta$.

17. The interconnect system of claim 16 wherein the fanout arrays of each of said connection pad arrays are parallel to each other and positioned at respectively different distances from the center of the circle.

18. The interconnect system of claim 17, wherein said fanout arrays of each of said connection pad arrays are symmetrical about a respective midpoint line extending from the center of the circle in a direction perpendicular to the sides of the respective fanout arrays.

19. The interconnect system of claim 16, wherein the fanout arrays of each of said connection pad arrays are arranged around, and positioned at equal distances from, the center of the respective circle.

20. The interconnect system of claim 16, wherein at least one of said substrates comprises a flexible printed circuit substrate.

* * * * *